United States Patent [19]
Lin et al.

[11] Patent Number: 6,114,196
[45] Date of Patent: Sep. 5, 2000

[54] METHOD OF FABRICATING METAL-OXIDE SEMICONDUCTOR TRANSISTOR

[75] Inventors: Yei-Hsiung Lin, Hsinchu; Chen-Bin Lin, Taipei; Yu-Ju Liu, Hsinchu; Chin-Chun Huang, Taichung, all of Taiwan

[73] Assignee: United Microelectronics Corp., Hsinchu, Taiwan

[21] Appl. No.: 09/227,959

[22] Filed: Jan. 11, 1999

[51] Int. Cl.[7] .................... H01L 21/8234; H01L 21/336; H01L 21/31
[52] U.S. Cl. .................... 438/197; 438/257; 438/761
[58] Field of Search .................... 438/301, 303, 438/283, 197, 257, 510, 518, 761, 922, 923

[56] References Cited

U.S. PATENT DOCUMENTS

| | | | |
|---|---|---|---|
| 5,093,700 | 3/1992 | Sakata | 357/23.1 |
| 5,164,333 | 11/1992 | Schwalke et al. | 437/200 |
| 5,298,447 | 3/1994 | Hong | 437/43 |
| 5,350,698 | 9/1994 | Huang et al. | 437/26 |
| 5,393,687 | 2/1995 | Liang | 437/46 |
| 5,441,904 | 8/1995 | Kim et al. | 437/40 |
| 5,567,638 | 10/1996 | Lin et al. | 437/46 |
| 5,652,156 | 7/1997 | Liao et al. | 437/40 |
| 5,712,181 | 1/1998 | Byun et al. | 437/46 |
| 5,767,004 | 6/1998 | Balasubramanian et al. | 438/592 |

*Primary Examiner*—Matthew Smith
*Assistant Examiner*—Lex H. Malsawma
*Attorney, Agent, or Firm*—J. C. Patents; Jiawei Huang

[57] ABSTRACT

A method of fabricating a MOS transistor. An undoped multi-layer stacked polysilicon structure is formed on a gate oxide layer and then being doped to increase conductivity. After that, the multi-layer stacked polysilicon structure and the gate oxide layer are patterned to form a gate electrode. A source/drain region is formed by ion implantation with the gate electrode as a mask.

8 Claims, 2 Drawing Sheets

METHOD OF FABRICATING METAL-OXIDE SEMICONDUCTOR TRANSISTOR

BACKGROUND OF THE INVENTION

1. Field of the Invention

This invention relates in general to a method of fabricating a semiconductor device, and more specifically relates to a method of fabricating a metal-oxide semiconductor (MOS) transistor.

2. Description of Related Art

The fundamental structure of a MOS comprises a gate, a source and a drain regions in a substrate, wherein the gate further comprises a conductive layer and a gate oxide layer. Generally speaking, the material of conductive layer is polysilicon, which is the same as silicon in nature, and that of the gate oxide layer is $SiO_2$. The source/drain regions are located in the substrate on opposite sides of the gate.

FIGS. 1A–1B illustrate steps in a process for forming a MOS transistor by a prior art method. Referring FIG. 1A, a substrate 10 is provided. Then a field oxide 12, is formed using the local oxidation of silicon (LOCOS) to define an active region 14. An oxide layer is deposited by thermal oxidation method to form a gate oxide layer. A polysilicon layer is deposited by low-pressure chemical vapor deposition (LPCVD), and the polysilicon layer is doped to enhance the conductivity of the polysilicon layer. Thereafter, the oxide layer and polysilicon layer are patterned to form the gate oxide layer 16 and polysilicon layer 18, resulting in the formation of the gate electrode 20.

Referring to FIG. 1B, lightly doped source/drain regions are formed in the substrate 10 by ion implanting the substrate 10 with a lower concentration dopant in a self-aligned process using the gate electrode 20 and the field oxide layer 12 as a mask. An oxide layer is formed and the oxide layer is anisotropically etched back to form spacers 24 on the sidewalls of gate electrode 20. Heavily doped source/drain regions 26 are formed in the substrate 10 by ion implanting higher concentrations of dopant into the substrate 10 using field oxide layer 12, gate electrode 20 and spacers 24 as a mask. A channel region 28 is formed under the gate oxide layer 16 and between the lightly doped source/drain regions 22. Follow-up steps, such as an annealing process, are performed to activate the dopants. However, those steps are well known to persons skilled in this art, so no detailed description thereof is needed here.

From a microscopic point of view, the polysilicon layer 18 of gate electrode 20 is a pure silicon material which is composed of single crystals of silicon grains with different crystal orientations, and there are grain boundaries between each single crystal of the silicon grains. Since there are several kinds of line defects and point defects in the grain boundaries, the diffusion ability of dopants through the grain boundaries is better than that diffusing though the interior grains. Therefore, the conductivity of the polysilicon layer can be changed via the doping process.

However, the disadvantage of producing a MOS transistor according to the prior art method is the formation of a leakage current. The polysilicon layer 18 of the gate electrode 20 undergoes one doping step. The dopants, which are used to form the source/drain regions 26 in the ion implantation step and the polysilicon layer in the doping step, penetrate into the channel region 28 through the grain boundaries of polysilicon layer. Moreover, those dopants also diffuse in the annealing step into the channel region 28 through the grain boundaries of polysilicon layer. These two effects cause leakage current.

SUMMARY OF THE INVENTION

Accordingly, this invention provides a method of producing a MOS transistor, which can prevent the dopants from penetrating and diffusing into the channel region, and thus avoid leakage current.

The present invention achieves the above-identified objects by providing a method of fabricating a MOS transistor. The method comprises the step of forming a gate oxide layer on the substrate, and forming an undoped multi-layered polysilicon structure on the gate oxide layer. After that, the undoped multi-layered polysilicon structure is doped. The polysilicon layer and gate oxide layer are patterned to form the gate electrode. Spacers are formed on the sidewalls of the gate electrode, and source/drain regions are formed in the substrate on opposite sides of the gate electrode. In addition, follow-up steps are performed to complete the MOS transistor.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description made in connection with the accompanying drawings in which:

DESCRIPTION OF THE PREFERRED EMBODIMENT

Figure 1A:
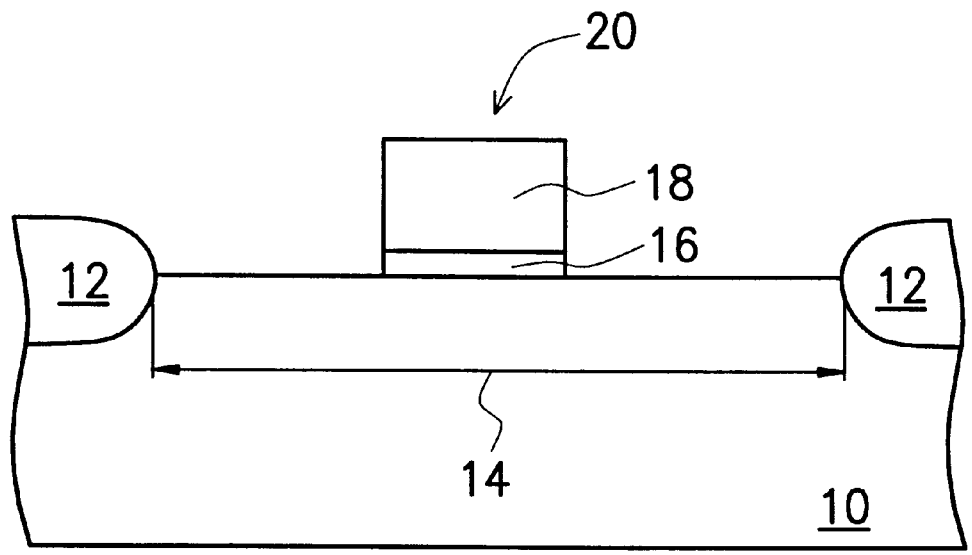
FIGS. 1A through 1B are schematic, cross-sectional drawings representing the fabricating steps of forming a MOS transistor according to the prior art.
Figure 1B:
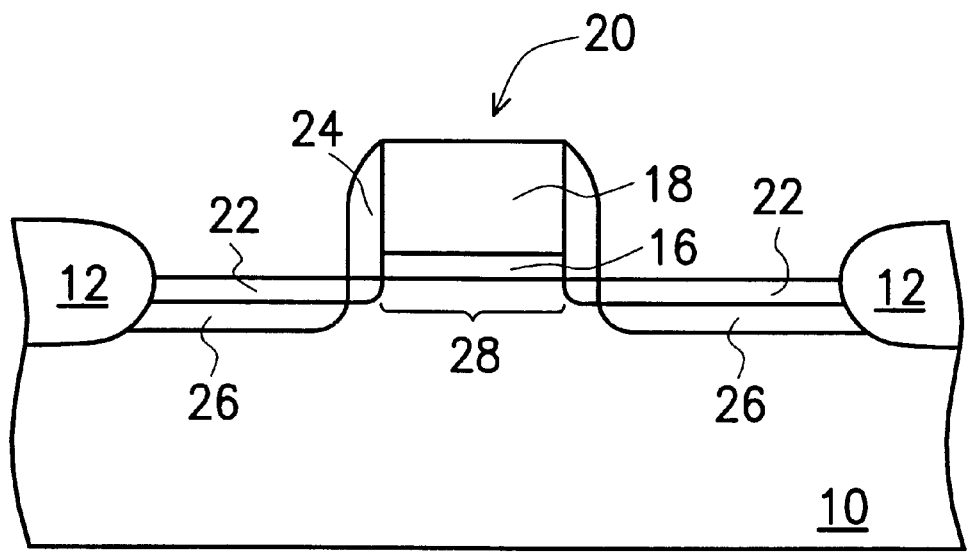
Figure 2A:
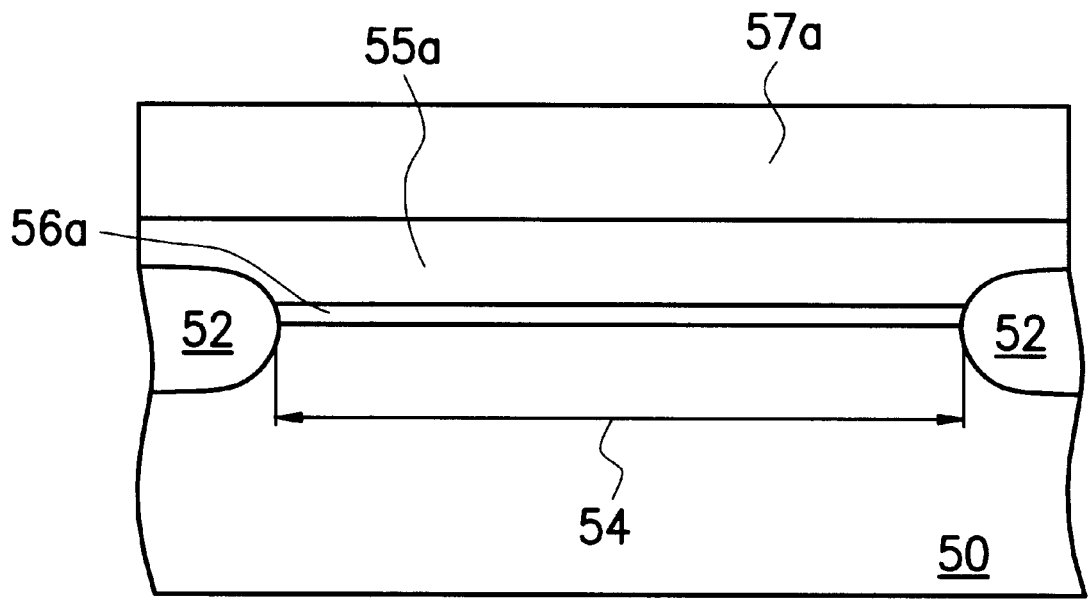
FIGS. 2A through 2B are schematic, cross-sectional drawings representing the fabrication steps of forming a MOS transistor in accordance with the preferred embodiment of the present invention.
Figure 2B:
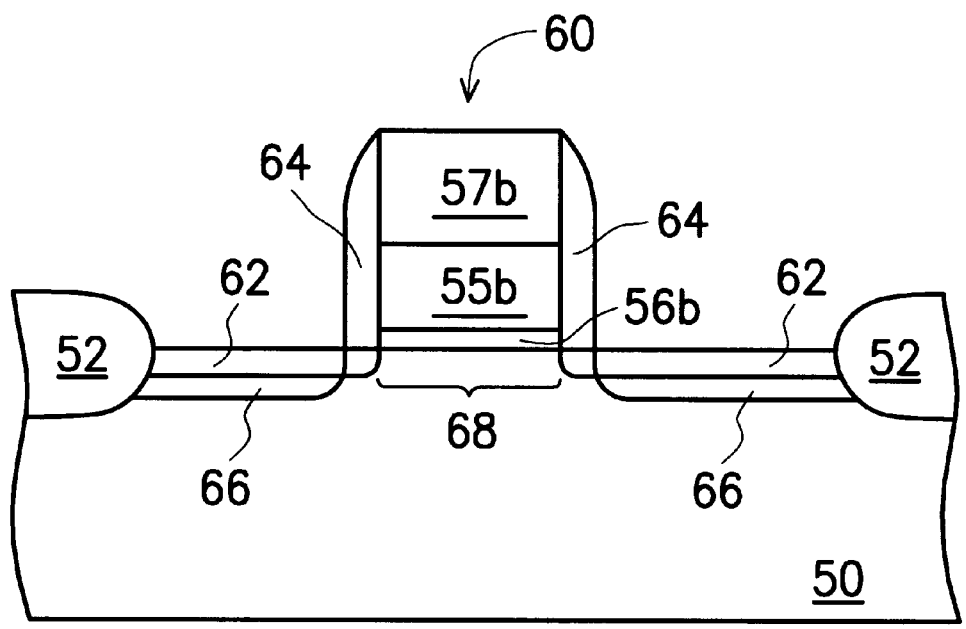

FIGS. 2A–2B illustrate steps taken in a process to form a MOS transistor in accordance with the preferred embodiment of the present invention.

Referring to FIG. 2A, a device isolation structure, such as a field oxide 52 which is formed by a LOCOS, is formed in a semiconductor substrate 50 in order to define an active region 54. An oxide layer 56a is deposited by using thermal oxidation on the active region 54 of the substrate 50. An undoped polysilicon layer 55a is deposited on the oxide layer 56a by LPCVD. Another undoped polysilicon layer 57a is deposited on the undoped polysilicon layer 55a by LPCVD. Those two polysilicon layers 55a, 57a are doped by ion implantation in order to enhance the conductivity of the polysilicon.

One of the characteristics of the present invention is that a multi-layered polysilicon structure, such as a two-layered polysilicon structure comprising the undoped polysilicon layers 55a and 57a is deposited. As a consequence, the dopants doped by an ion implantation step do not penetrate and diffuse into the substrate 50 under the gate oxide layer 56a. However, the present invention is not limited to forming a two-layered polysilicon structure. It is rather, the present invention is also appropriate for forming a multi-layered polysilicon structure. To simplify description, a two-layered polysilicon structure is used here as an illustration. A multi-layered polysilicon has different grain boundaries in different layers, and those grain boundaries between different polysilicon layers are not continuous, so that using an undoped multi-layered polysilicon structure can prevent dopants from penetrating and diffusing into the substrate under the gate oxide layer 56*a*.

Referring to FIG. 2B, the oxide layer 56*a* and polysilicon layers 55*a*, 57*a* are patterned to form a gate oxide layer 56*b* and polysilicon layers 55*b*, 57*b*. As a result, a gate electrode 60 comprises a gate oxide layer 56*b* and polysilicon layers 55*b*, 57*b* is formed.

Lightly doped source/drain regions 62 are formed in the substrate 50 by implanting ions with a lower concentration on the substrate 50 in a self-aligned process using the gate electrode 60 and the field oxide layer 52 as a mask. An oxide layer is formed and anisotropically etched back to form spacers 64 on the sidewalls of gate electrode 60. Heavily doped source drain regions 66 are formed in the same, self-aligned process of ion implantation with a heavier concentration of ions and using the field oxide 52, the gate electrode 60 and spacers 64 as a mask. A channel is formed under the gate oxide layer 56*b* and between source/drain regions 66. Follow-up steps such as an annealing process are performed to activate the dopants. However, these follow-up steps are well known to persons skilled in this art and are not further detailed here.

This method of producing a MOS transistor with multi-layer polysilicon, as provided by the present invention, is able to prevent leakage current in the channel, and further more improves the yield of product up to about 85%.

The present invention uses the formation of a multi-layered polysilicon structure, such as a two-layered polysilicon structure, as the gate electrode. Because the polysilicon layers have different grain boundaries in different layers, the dopants implanted during an ion implantation method do not penetrate and diffuse into the channel under the gate oxide layer, and the phenomenon of leakage current can be avoided.

While the present invention has been described with a preferable embodiment, this description is not intended to limit the invention. Various modifications of the embodiment will be apparent to those skilled in the art. It is therefore contemplated that the appended claims will cover any such modifications or embodiments as fall within the true scope of the invention.

What claimed is:

1. A method for fabricating a metal oxide semiconductor transistor comprising:

providing a substrate;

forming an oxide layer over the substrate;

forming at least a first polysilicon layer and a second polysilicon layer over the oxide layer, wherein the first polysilicon layer and the second polysilicon layer are undoped;

doping ions into the first and the second polysilicon layers;

patterning the first and the second doped polysilicon layers and the oxide layer to form a gate electrode; and forming a source/drain region in the substrate with the gate electrode as a mask.

2. The method of claim 1, wherein the step of forming the first polysilicon layer comprises LPCVD.

3. The method of claim 1, wherein the step of forming the second polysilicon layer comprises LPCVD.

4. The method of claim 1, wherein the step of forming the source/drain region in the substrate comprises:

performing a first implantation to form a lightly doped region in the substrate on each side of the gate electrode;

forming a spacer on each sidewall of the gate electrode; and performing a second implantation to form a heavily doped region in the substrate, using the gate electrode and the spacer as a mask, wherein the lightly doped region and the heavily doped region serve together as the source/drain region.

5. A method for eliminating a leakage current in a metal oxide semiconductor transistor, comprising:

providing a substrate;

forming a gate oxide layer covering the substrate;

forming a multi-layered polysilicon structure covering the substrate, wherein the multi-layered polysilicon structure is undoped;

doping the multi-layered polysilicon structure;

patterning the multi-layered polysilicon structure and the gate oxide layer to form a gate electrode; and forming a source/drain region on each side of the gate electrode in the substrate.

6. A method for fabricating a gate electrode comprising:

providing a substrate;

forming a gate oxide layer covering the substrate;

forming at least a first polysilicon layer and a second polysilicon layer covering the substrate, wherein the first polysilicon layer and the second polysilicon layer are undoped;

doping the first polysilicon layer and the second polysilicon layer by implanting ions; and patterning the multi-layer polysilicon layer and the gate oxide layer to form a gate electrode.

7. The method of claim 6, wherein the step of forming the multi-layer polysilicon layer comprises LPCVD.

8. The method of claim 6, wherein the multi-layer polysilicon layer is a two-layer polysilicon layer.

* * * * *